(12) United States Patent
Wei et al.

(10) Patent No.: US 11,764,274 B2
(45) Date of Patent: Sep. 19, 2023

(54) MEMORY DEVICE HAVING CONTACT PLUGS WITH NARROWER AND WIDER PORTIONS

(71) Applicant: Winbond Electronics Corp., Taichung (TW)

(72) Inventors: Cheng-Hong Wei, Taichung (TW); Chien-Hsiang Yu, Taichung (TW); Hung-Sheng Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 278 days.

(21) Appl. No.: 17/321,485

(22) Filed: May 16, 2021

(65) Prior Publication Data

US 2021/0273064 A1    Sep. 2, 2021

Related U.S. Application Data

(62) Division of application No. 16/542,282, filed on Aug. 15, 2019, now Pat. No. 11,056,564.

(30) Foreign Application Priority Data

Dec. 21, 2018 (TW) ................................. 107146380

(51) Int. Cl.
*H01L 29/417* (2006.01)
*H01L 21/28* (2006.01)
(Continued)

(52) U.S. Cl.
CPC .... *H01L 29/41758* (2013.01); *H01L 21/0217* (2013.01); *H01L 21/32133* (2013.01);
(Continued)

(58) Field of Classification Search
CPC .................... H01L 29/41758; H01L 29/66825
See application file for complete search history.

(56) References Cited

U.S. PATENT DOCUMENTS

2002/0097607 A1* 7/2002 Sakakibara ......... H01L 29/7885
365/185.27
2016/0351579 A1* 12/2016 Hong ................ H01L 29/42324
2018/0033866 A1    2/2018 Liao et al.

FOREIGN PATENT DOCUMENTS

CN         1549306        11/2004
CN       106920771         7/2017
(Continued)

OTHER PUBLICATIONS

"Office Action of China Counterpart Application", dated Aug. 22, 2022, p. 1-p. 7.

*Primary Examiner* — Jay C Chang
*Assistant Examiner* — Mikka Liu
(74) *Attorney, Agent, or Firm* — JCIPRNET

(57) ABSTRACT

Provided is a memory device including a substrate, a plurality of stack structures, a protective layer, and a plurality of contact plugs. The stack structures are disposed over the substrate. The protective layer conformally covers top surfaces and sidewalls of the stack structures. The contact plugs are respectively disposed over the substrate between the stack structures. One of the contact plugs includes a narrower portion and a wider portion over the narrower portion. In a top view, the wider portion is separated from an adjacent protective layer by a distance.

9 Claims, 12 Drawing Sheets

(51) Int. Cl.
  *H01L 21/768* (2006.01)
  *H01L 21/3213* (2006.01)
  *H01L 21/02* (2006.01)
  *H01L 29/788* (2006.01)
  *H01L 29/66* (2006.01)
  *H10B 41/30* (2023.01)
  *H01L 21/027* (2006.01)

(52) U.S. Cl.
  CPC .. *H01L 21/32139* (2013.01); *H01L 21/76877* (2013.01); *H01L 29/40114* (2019.08); *H01L 29/66825* (2013.01); *H01L 29/7883* (2013.01); *H10B 41/30* (2023.02); *H01L 21/0276* (2013.01)

(56) References Cited

FOREIGN PATENT DOCUMENTS

| | | |
|---|---|---|
| JP | 2010073858 | 4/2010 |
| JP | 2010123784 | 6/2010 |
| KR | 20050066192 | 6/2005 |

\* cited by examiner

MEMORY DEVICE HAVING CONTACT PLUGS WITH NARROWER AND WIDER PORTIONS

CROSS-REFERENCE TO RELATED APPLICATION

This application is a divisional application of and claims the priority benefit of U.S. application Ser. No. 16/542,282, filed on Aug. 15, 2019, now allowed, which claims the priority benefit of Taiwan application serial no. 107146380, filed on Dec. 21, 2018. The entirety of each of the above-mentioned patent applications is hereby incorporated by reference herein and made a part of this specification.

BACKGROUND

Technical Field

The present invention relates to a semiconductor device and a method of manufacturing the same, and more particularly to a memory device and a method of manufacturing the same.

Description of Related Art

With the advancement of semiconductor technology, the size of semiconductor memory devices has become smaller and smaller, so that the integration of the semiconductor memory devices increases, thereby integrating more components with more functions on the same chip. In this case, the line width in the semiconductor memory devices is also gradually reduced, so that the electronic product become lighter, thinner, and smaller. However, when the line width in devices is getting smaller and smaller, the semiconductor process technology will face many challenges.

SUMMARY

The disclosure provides a memory device including a substrate, a plurality of stack structures, a protective layer, and a plurality of contact plugs. The stack structures are disposed over the substrate. The protective layer conformally covers top surfaces and sidewalls of the stack structures. The contact plugs are respectively disposed over the substrate between the stack structures. One of the contact plugs includes a narrower portion and a wider portion over the narrower portion. In a top view, the wider portion is separated from an adjacent protective layer by a distance.

The disclosure provides a method of manufacturing a memory device including following steps: forming a plurality of stack structures on a substrate; conformally forming a protective layer on top surfaces and sidewalls of the plurality of stack structures; forming a conductive layer on the substrate to fill in spaces between the plurality of stack structures; performing a first patterning process to pattern the conductive layer into a plurality of conductive strips; performing a second patterning process to pattern one of the conductive strips into a plurality of conductive pillars; and performing a replacement process to replace others of the conductive strips and the plurality of conductive pillars by a plurality of contact plugs.

DESCRIPTION OF THE EMBODIMENTS

FIG. 1A to FIG. 1K are schematic cross-sectional views illustrating a manufacturing process of a memory device according to an embodiment of the disclosure. FIG. 2A, FIG. 2B, FIG. 2D, and FIG. 2E are schematic top views of FIG. 1A, FIG. 1B, FIG. 1D, and FIG. 1E, respectively. FIG. 3E is a cross-sectional view along line III-III' depicted in FIG. 2E.

Figure 1A:
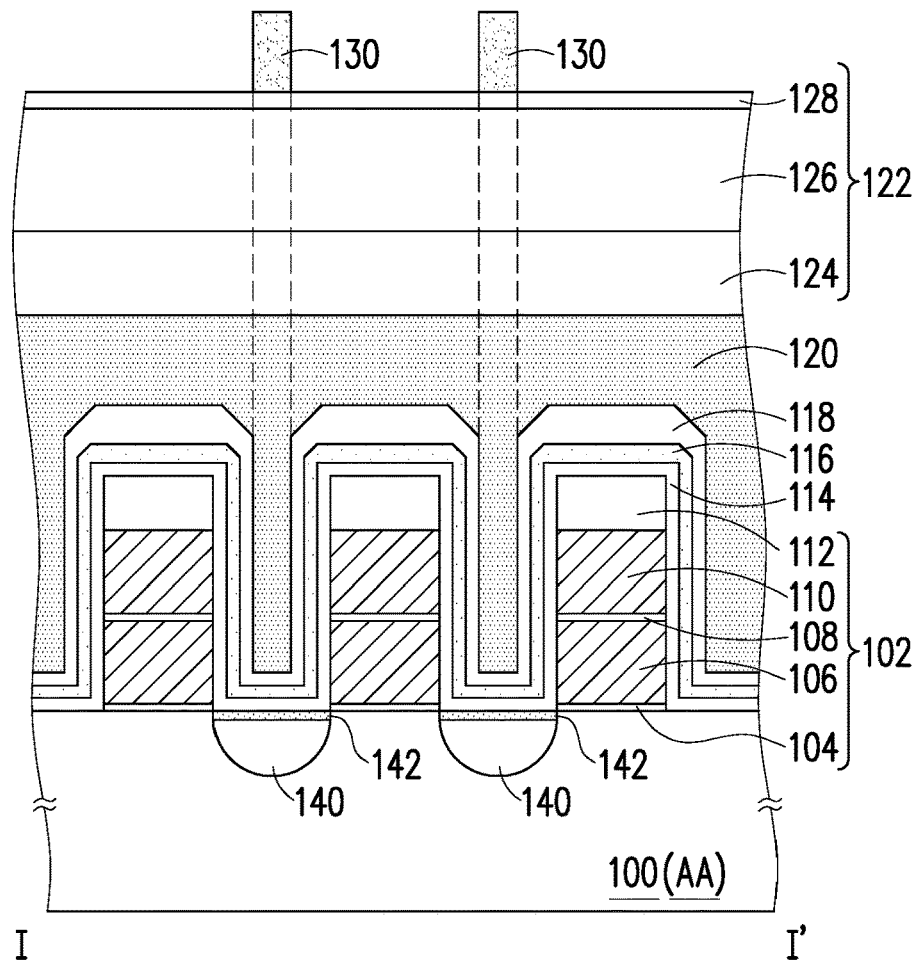
FIG. 1A to FIG. 1K are schematic cross-sectional views illustrating a manufacturing process of a memory device according to an embodiment of the disclosure.
Figure 2A:
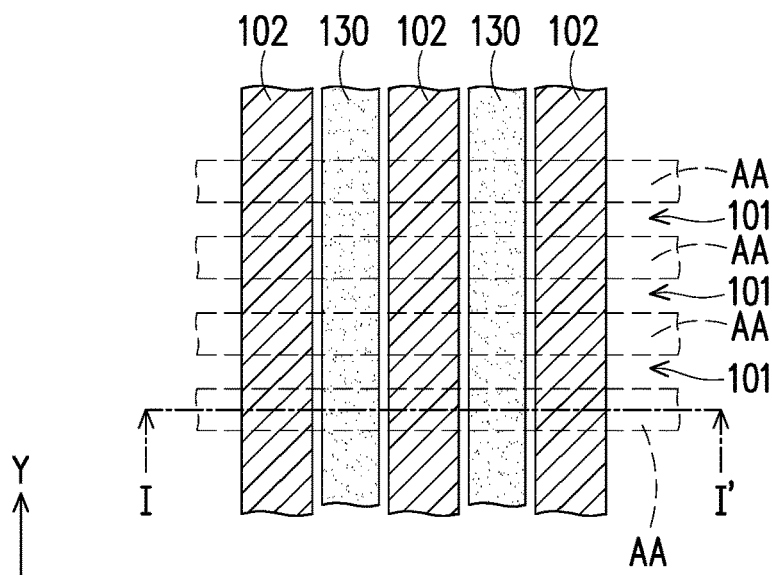
FIG. 2A, FIG. 2B, FIG. 2D, and FIG. 2E are schematic top views of FIG. 1A, FIG. 1B, FIG. 1D, and FIG. 1E, respectively.
Figure 1B:
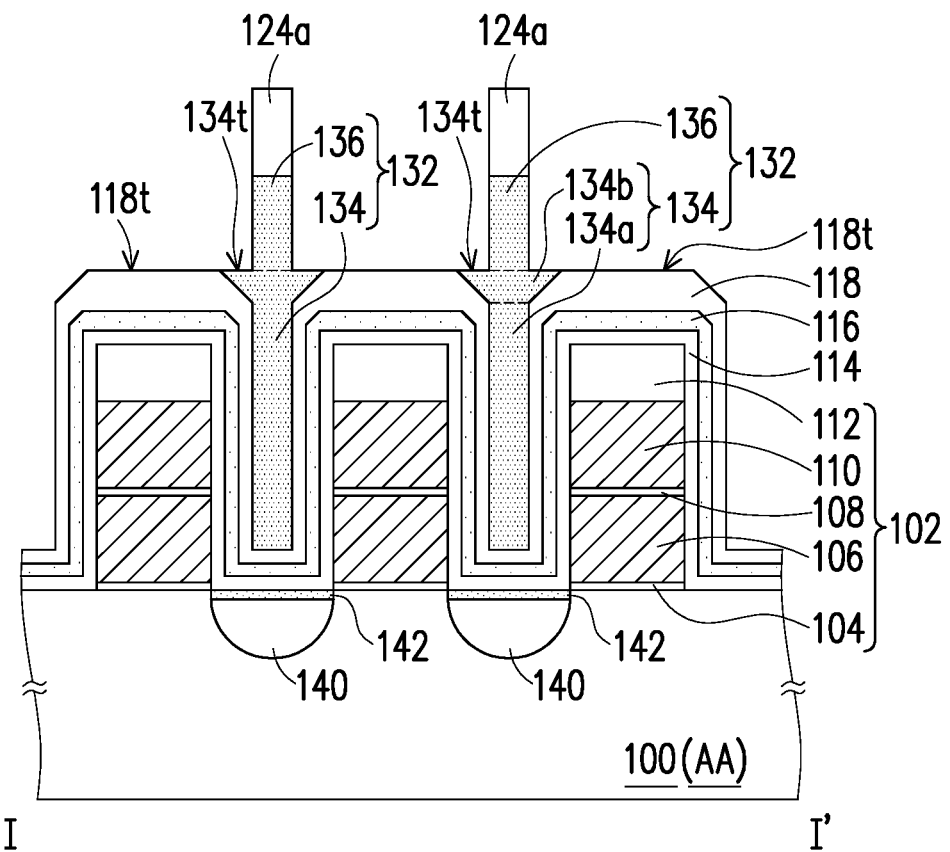
Figure 2B:
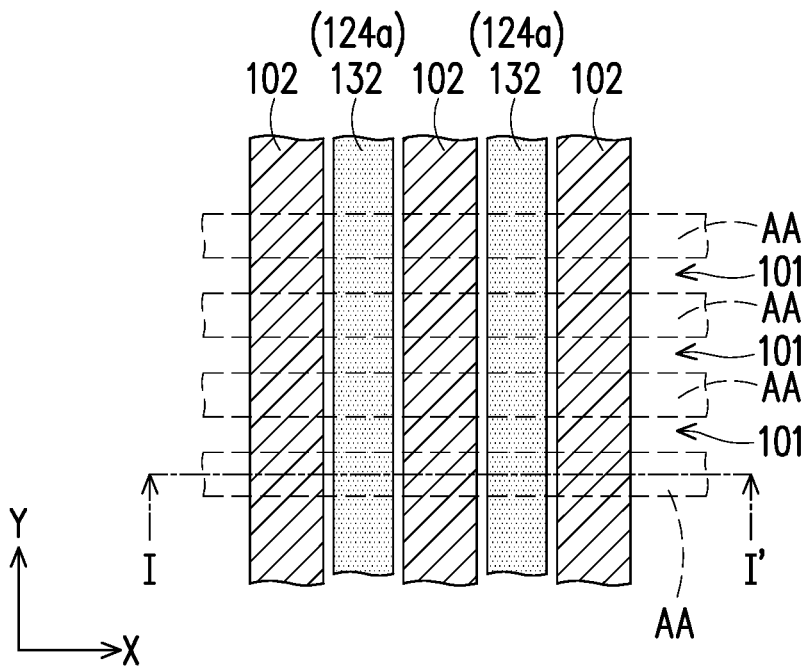
Figure 1C:
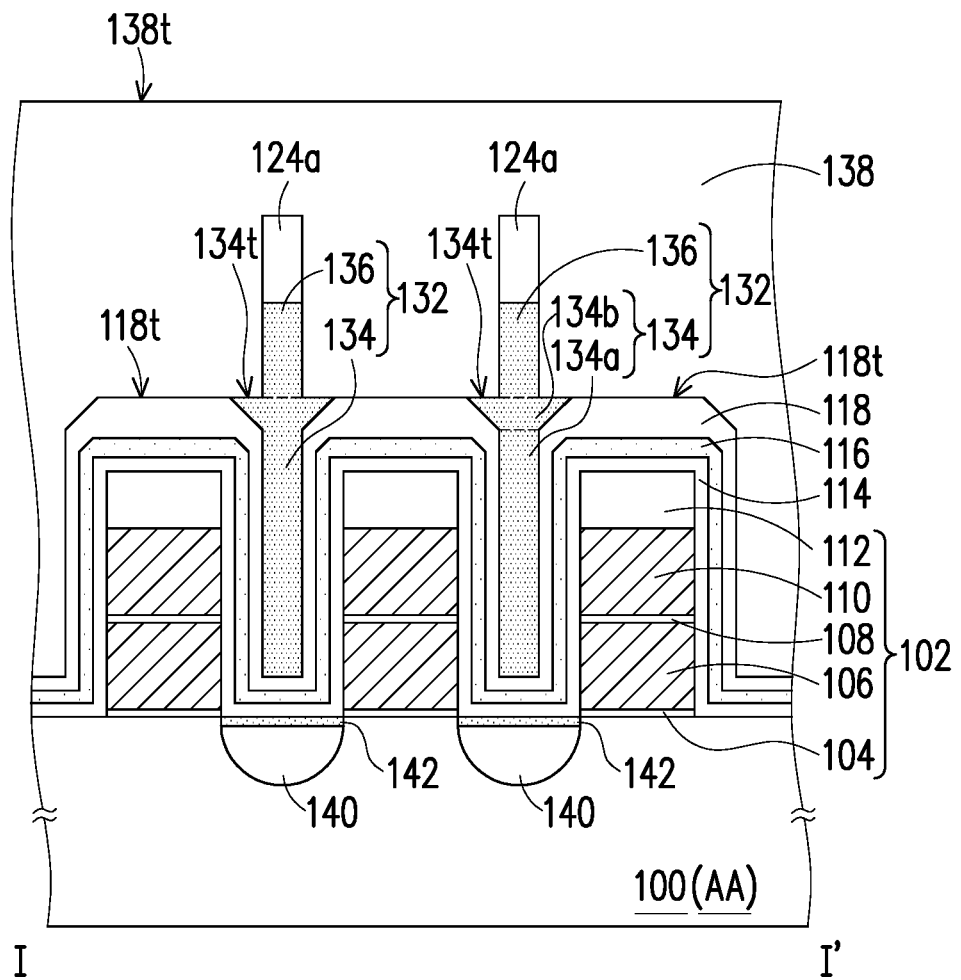
Figure 1D:
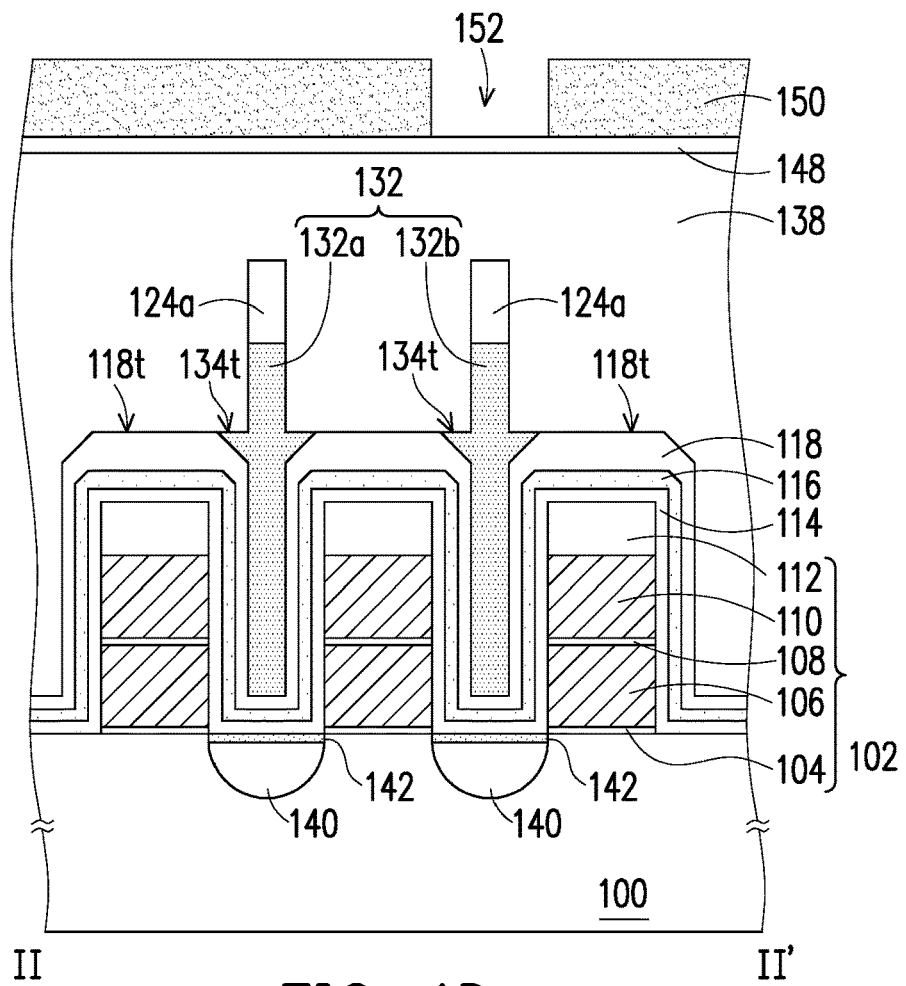
Figure 1E:
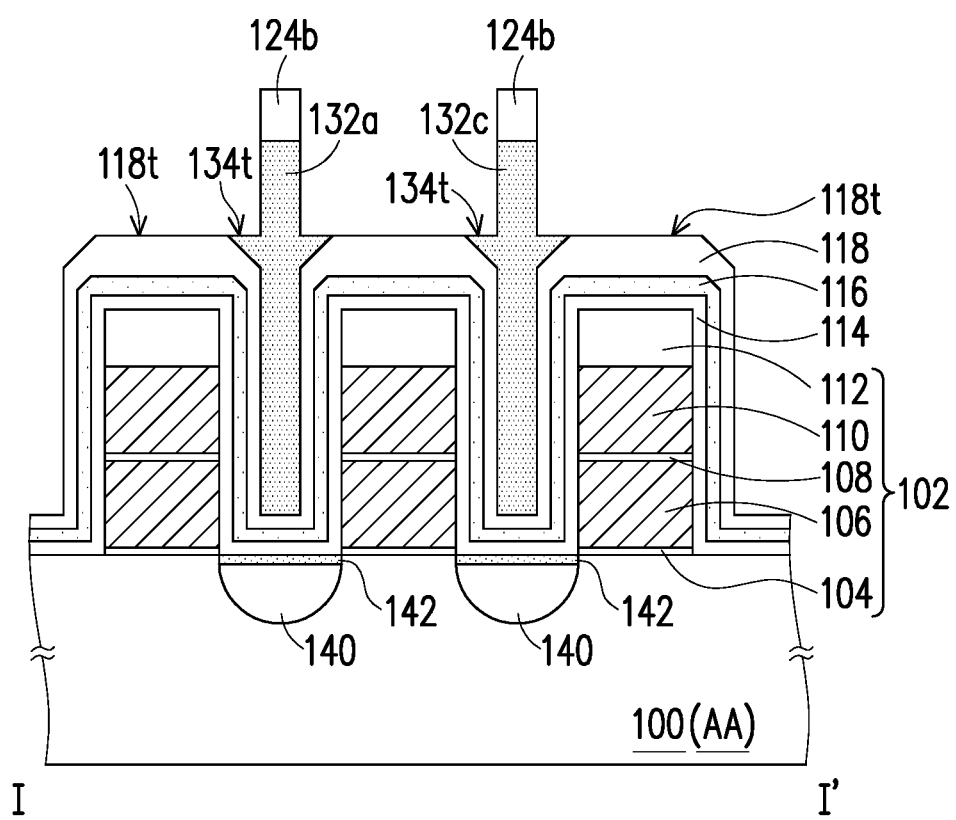
Figure 1F:
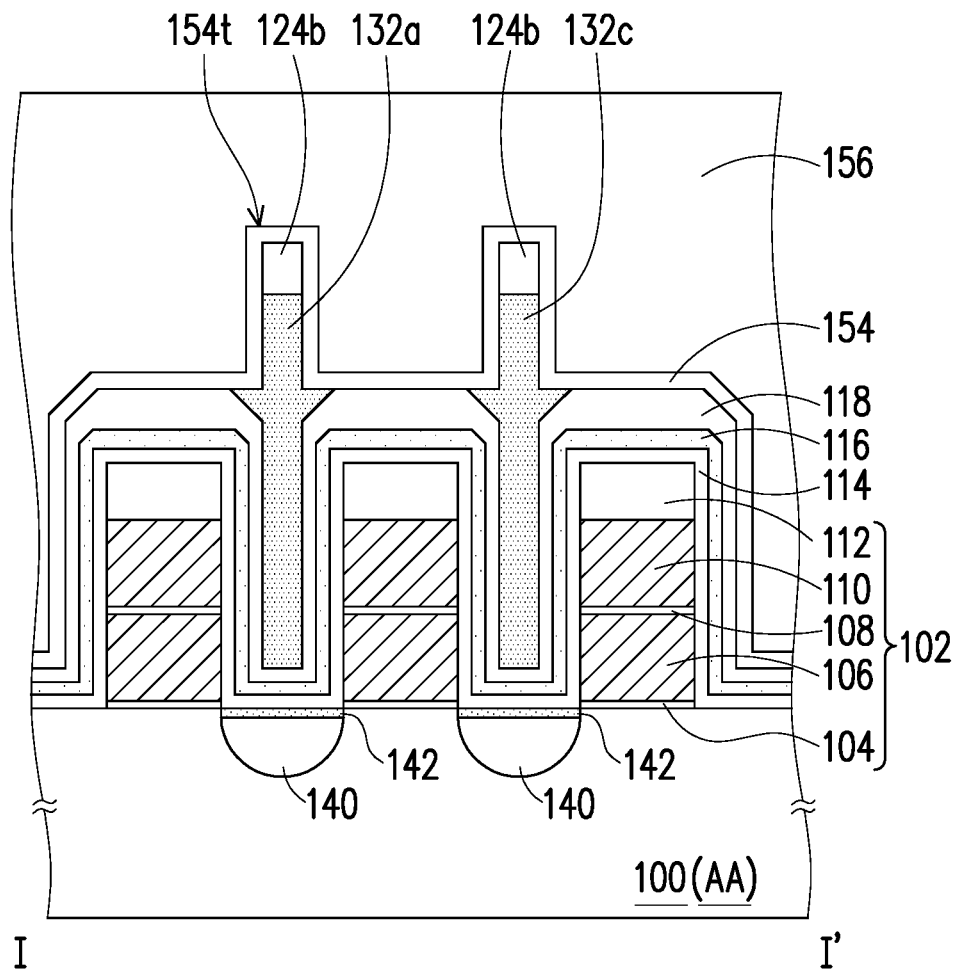
Figure 1G:
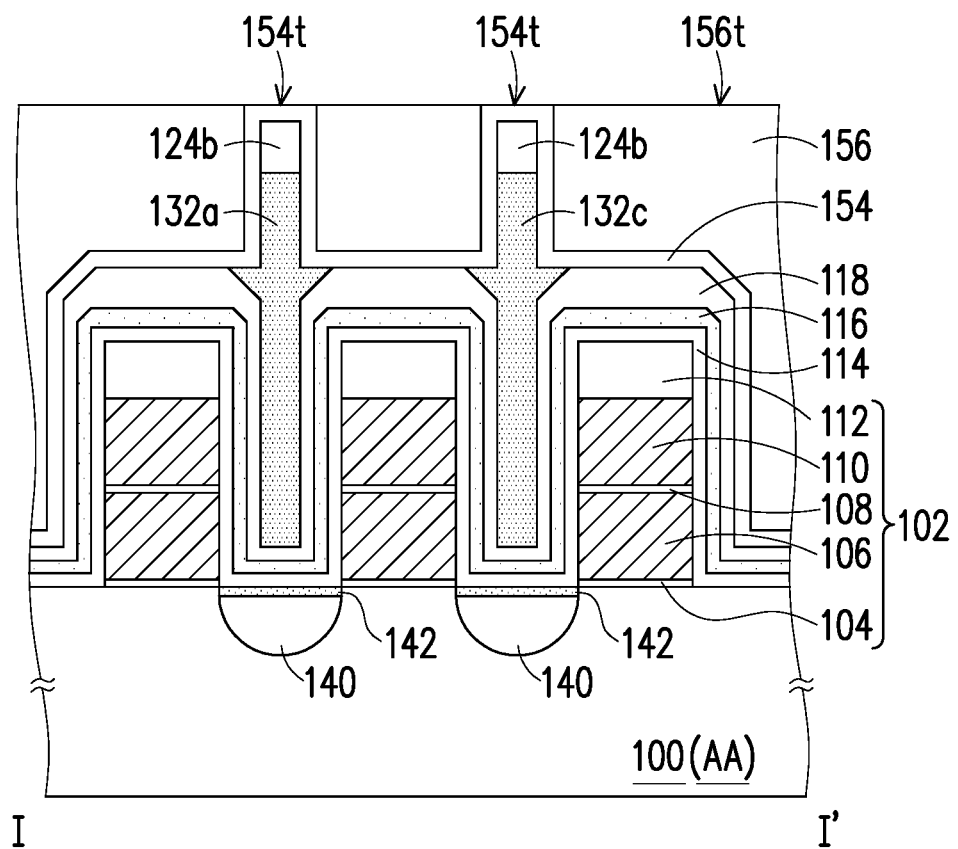
Figure 1H:
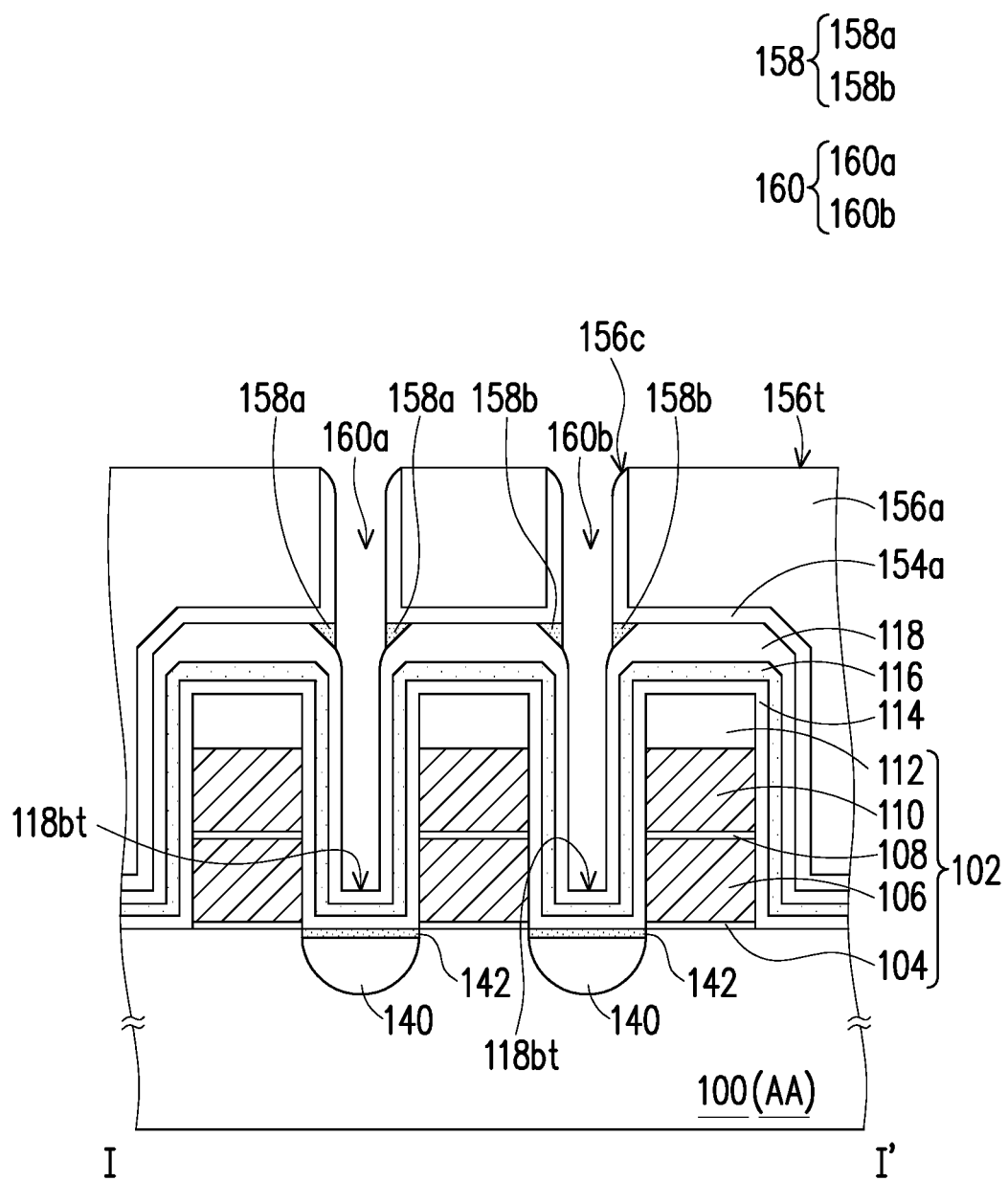
Figure 1I:
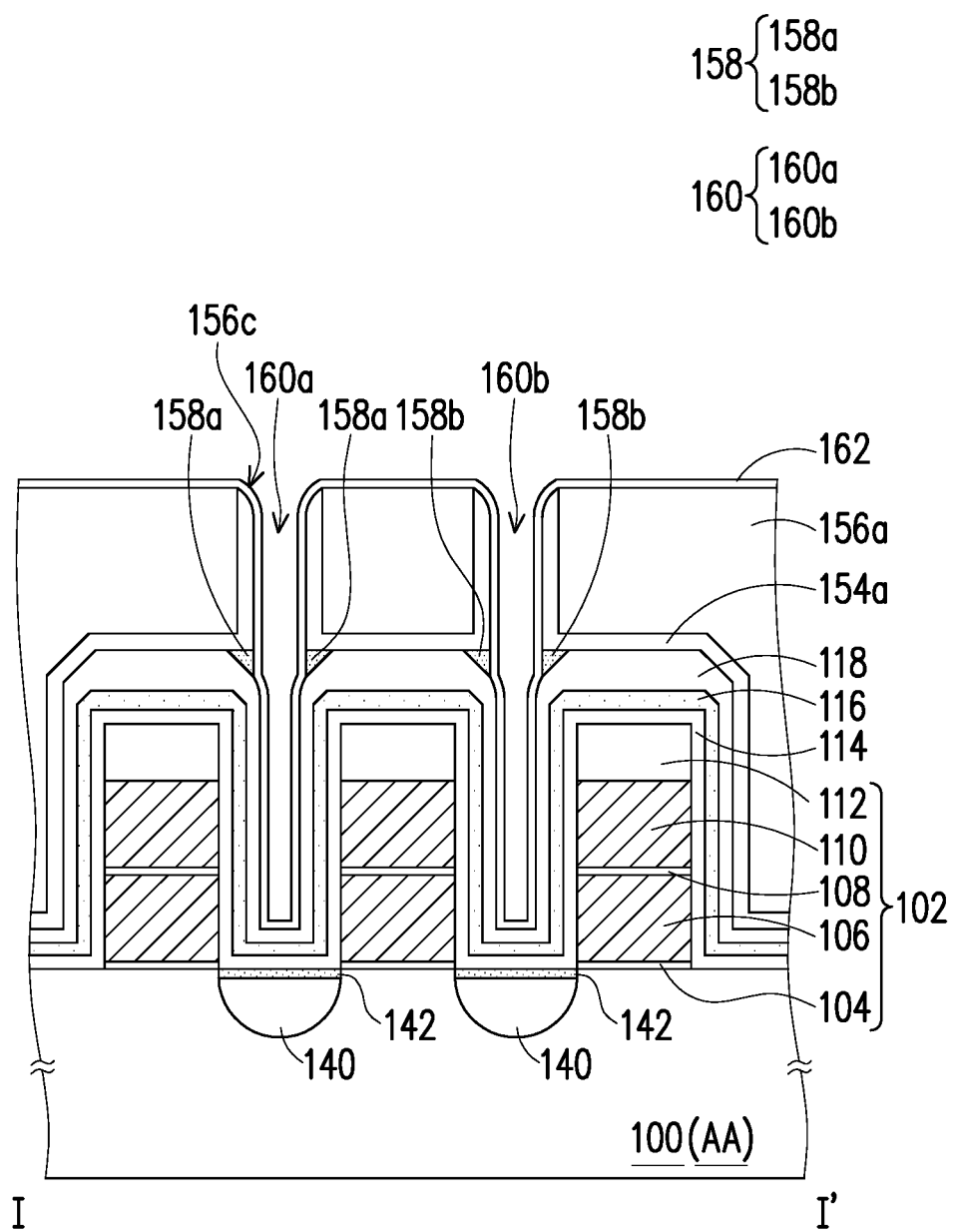
Figure 1J:
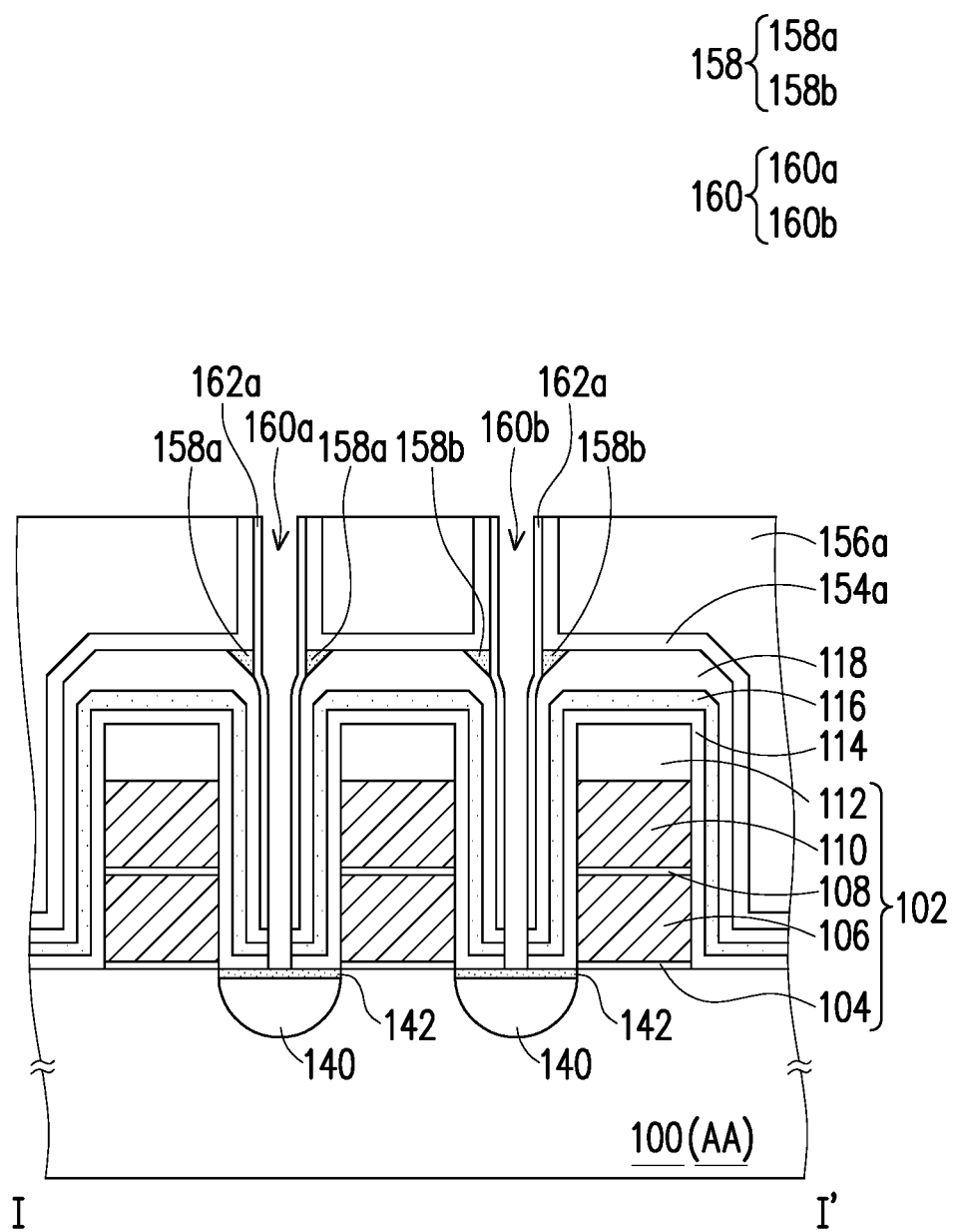
Figure 1K:
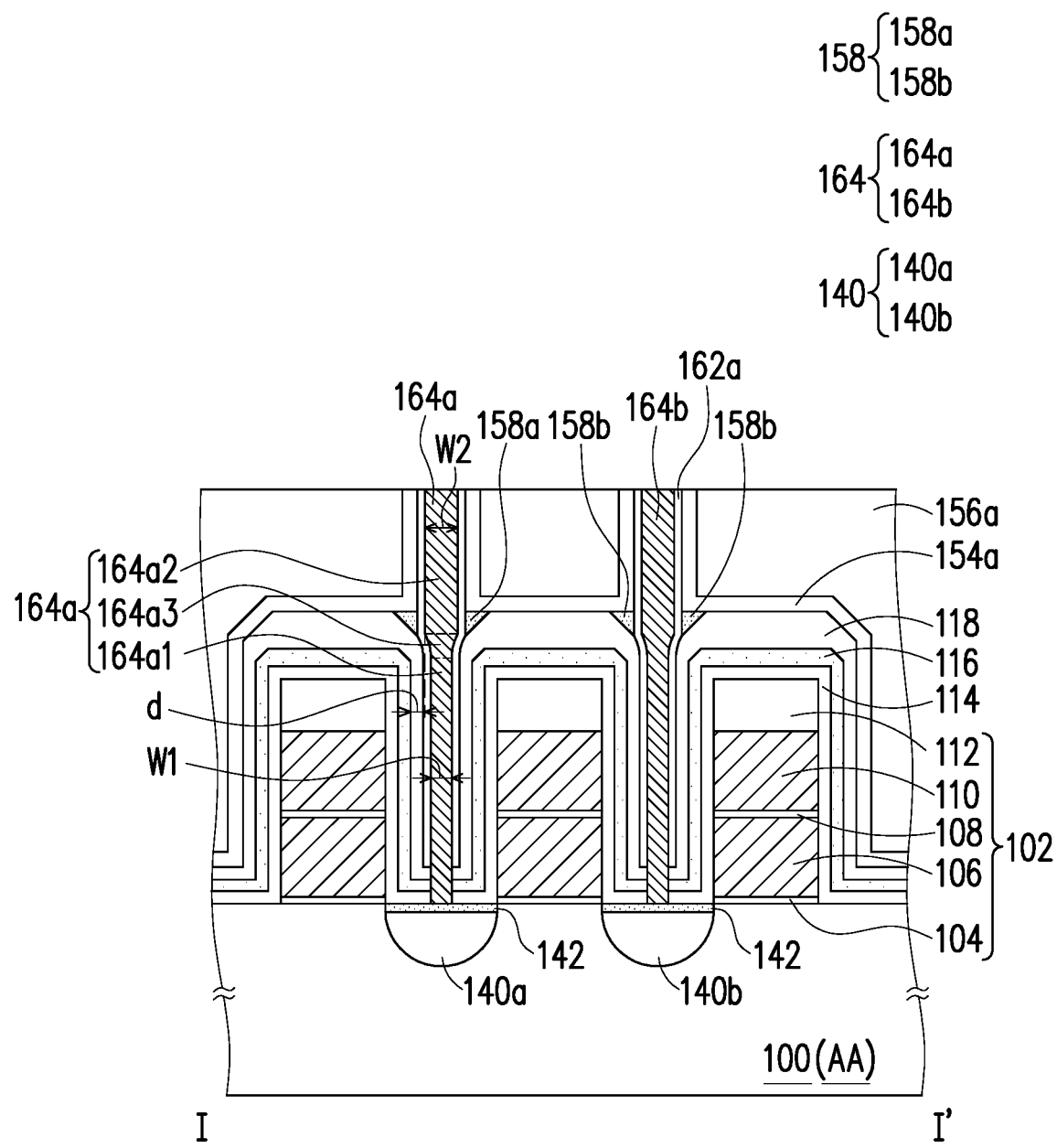
Figure 3E:
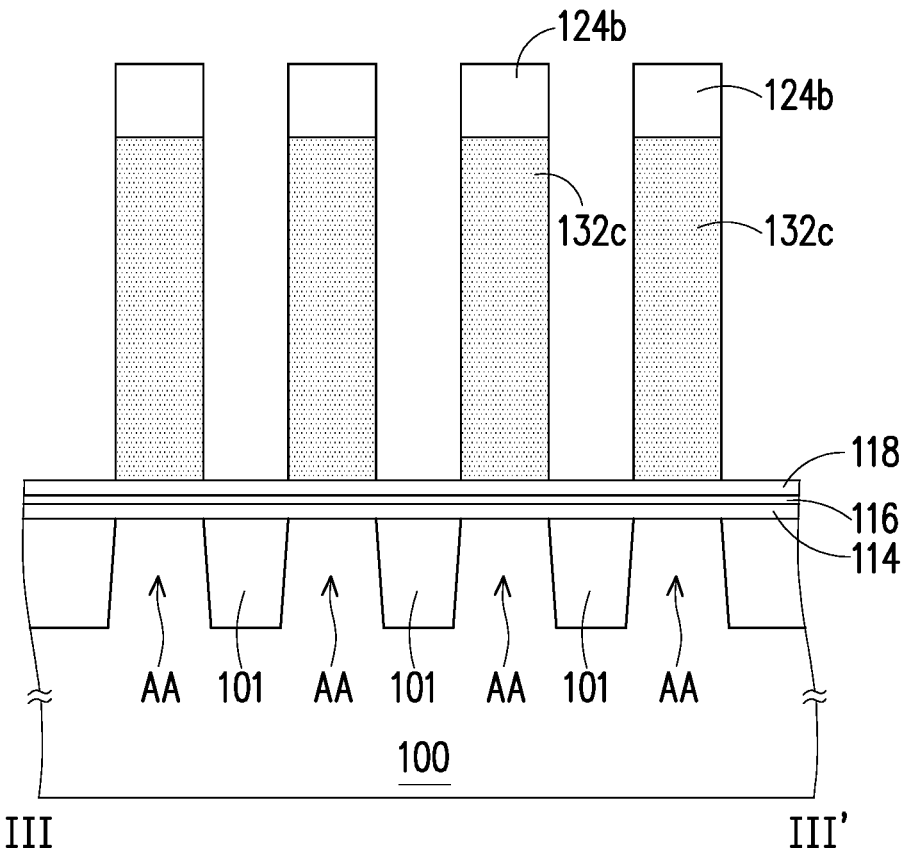
FIG. 3E is a cross-sectional view along line III-III' depicted in FIG. 2E.

Referring to FIG. 1A and FIG. 2A, in the present embodiment, a method of manufacturing a memory device 10 (as shown in FIG. 1K) includes following steps. First, an initial structure 10a includes a substrate 100, a plurality of stack structures 102, dielectric layers 114, 118, a protective layer 116, and a conductive layer 120. As shown in FIG. 2A, an isolation structure 101 is disposed in substrate 100 to define a plurality of active areas AA. The active areas AA extend along a X direction. In this embodiment, the isolation structure 101 may be a shallow trench isolation (STI) structure.

As shown in FIG. 1A, the stack structures 102 are disposed on the substrate 100 As shown in FIG. 2A, the stack structures 102 may be strip structures across the active areas AA. Although only three stack structures 102 illustrated in FIG. 2A, the invention is not limited thereto. In other embodiments, the number of the stack structures 102 may be adjusted as needed, which may be more than three, such as four, five, or more stack structures. In an embodiment, the stack structures 102 extend along a Y direction. The Y direction is perpendicular or orthogonal to the X direction. Specifically, each of the stack structures 102 sequentially from bottom to top includes: a tunneling dielectric layer 104, a floating gate 106, a barrier layer 108, a control gate 110, and a cap layer 112. The floating gate 106 includes a conductive material, which may be, for example, doped polysilicon, undoped polysilicon, or a combination thereof. The barrier layer 108 includes non-metal oxide, which may be, for example, silicon oxide, silicon nitride or a combination thereof. In the present embodiment, the barrier layer 108 may be referred to as an inter-gate dielectric layer, which may be a composite layer composed of oxide/nitride/oxide (ONO). The control gate 110 includes a conductive material, which may be, for example, doped polysilicon, undoped polysilicon, or a combination thereof. The cap layer 112 is, for example, silicon nitride or silicon oxide.

As shown in FIG. 1A, the dielectric layers 114, 118 conformally cover top surfaces and sidewalls of the stack structures 102. In an embodiment, the dielectric layers 114, 118 may be silicon oxide. The protective layer 116 is conformally disposed between the dielectric layer 114 and 118. In an embodiment, the protective layer 116 may be silicon nitride. In an alternative embodiment, a spacer (not shown) is included between the stack structures 102 and the dielectric layer 114 and the spacer is disposed on the sidewalls of the stack structures 102.

As shown in FIG. 1A, the conductive layer 120 is disposed on the dielectric layer 118. In detail, the conductive layer 120 fills in the spaces between the stack structures 102 and covers the top surfaces of the stack structures 102. In an embodiment, the conductive layer 120 may be, for example, doped polysilicon, undoped polysilicon, or a combination thereof.

In addition, as shown in FIG. 1A, before forming the dielectric layer 114, a plurality of doped regions 140 and a plurality of silicide layers 142 are respectively formed in the substrate 100 between the stack structures 102. In an embodiment, the doped regions 140 has a conductivity type opposite to a conductivity type of the substrate 100. For example, when the substrate 100 is a P-type conductivity type, the doped regions 140 are an N-type conductivity type; and vice versa. In the embodiment, the doped regions 140 may be, for example, source/drain (S/D) regions of the memory device. The silicide layers 142 are formed on the doped regions 140, respectively, to decrease the resistance value of the S/D regions. In an embodiment, the silicide layers 142 may be, for example, titanium silicide, cobalt silicide, nickel silicide, or a combination thereof.

Next, as shown in FIG. 1A, a mask layer 122 and a first photoresist pattern 130 are sequentially formed on the initial structure 10a. Specifically, the mask layer 122 includes a nitride layer 124, a hardmask layer 126, and an anti-reflection layer 128, wherein the hardmask layer 126 is disposed between the nitride layer 124 and the anti-reflection layer 128. In an embodiment, the nitride layer 124 may be, for example, silicon nitride. The hardmask layer 126 may be, for example, a suitable material such as a silicon material, a metal material, or a carbon material. The anti-reflection layer 128 may be, for example, a suitable material such as an organic polymer, carbon, silicon oxynitride, or the like. As shown in FIG. 1A, the first photoresist pattern 130 is disposed on the mask layer 122 between the stack structures 102 and corresponding to the doped regions 140 in the substrate 100. As shown in FIG. 2A, the first photoresist pattern 130 may be a strip structure across the active areas AA and extends along the Y direction. In an embodiment, the material of first photoresist pattern 130 may be, for example, a suitable material such as carbon, photoresist, or the like.

Referring to FIGS. 1A, 1B, 2A, and 2B, a first patterning process is performed to pattern the conductive layer 120 into a plurality of conductive strips 132. Specifically, a first etching process is performed by using the first photoresist pattern 130 as mask, so as to remove a portion of the mask layer 122. A second etching process is then performed by using a remaining mask layer 122 as a mask, so as to remove a portion of the conductive layer 120 and expose a top surface 118t of the dielectric layer 118.

After performing the second etching process, the conductive layer 120 covering the dielectric layer 118 becomes a plurality of conductive strips 132. The conductive strips 132 are disposed on the dielectric layer 118 between the stack structures 102, while the remaining nitride layers 124a are disposed on the conductive strips 132. In detail, as shown in FIG. 1B, one of the conductive strips 132 includes a lower portion 134 and an upper portion 136. The upper portion 136 protrudes upward from a top surface 134t of the lower portion 134. The lower portion 134 is embedded or filled in between the stack structures 102. The lower portion 134 includes a first portion 134a and a second portion 134b on the first portion 134a. As shown in the cross-sectional view 1B, the lower portion 134 may be a T-shape. That is, a top width of the second portion 134b of the lower portion 134 is greater than a top width of the first portion 134a of the lower portion 134. Although the top surface 134t of the lower portion 134 of the conductive strips 132 and a top surface 118t of the dielectric layer 118 are coplanar in FIG. 1B, the present invention is not limited thereto. In other embodiments, in order to completely remove the conductive layer 120 on the top surface 118t of the dielectric layer 118, the conductive layer 120 may be over-etched, so that the top surface 134t of the lower portion 134 of the lower portion 134 is lower than the top surface 118t of the dielectric layer 118.

Referring to FIG. 1C, a filling layer 138 is formed on the substrate 100. The filling layer 138 fills in gaps between the upper portions 136 of the conductive strips 132 and covers the top surfaces of the nitride layers 124a.

Figure 2D:
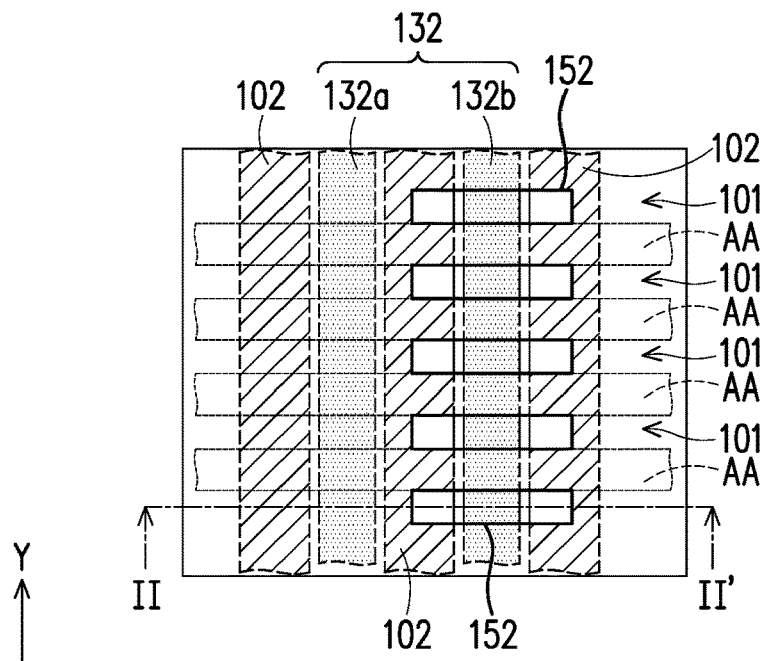

Referring to FIG. 1D and FIG. 2D, an anti-reflection layer 148 and a second photoresist pattern 150 are sequentially formed on the filling layer 138. The second photoresist pattern 150 has a plurality of openings 152, which correspond to the conductive strips 132b on one side of the stack structure 102. That is, the openings 152 are located directly above the conductive strips 132b on the one side of the stack structure 102, and not directly above the conductive strips 132a on another side of the stack structure 102. In addition, as shown in the top view 2D, the openings 152 are located directly above the conductive strips 132b on the isolation structure 101, and not directly above the conductive strips 132b on the active areas AA.

Figure 2E:
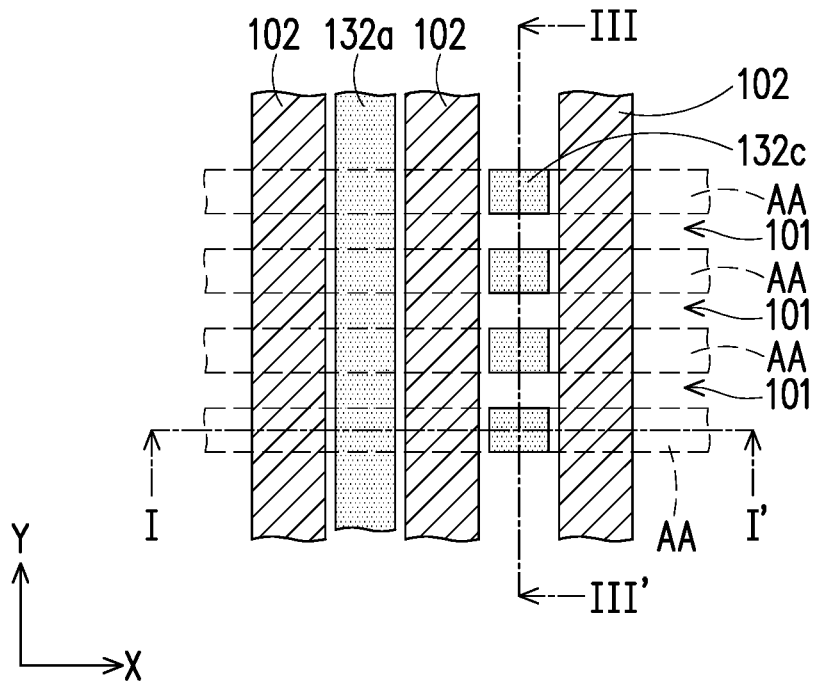

Referring to FIGS. 1D, 2D, 1E, 2E, and 3E, a second patterning process is performed to pattern the conductive strips 132b into a plurality of conductive pillars 132c. Specifically, a portion of the filling layer 138, a portion the nitride layers 124a, and a portion of the conductive strips 132b are removed by using the second photoresist pattern 150 as a mask, so as to form a plurality of conductive pillars 132c. As shown in FIG. 2E and FIG. 3E, the conductive pillars 132c are respectively disposed on the active areas AA. A remaining fill layer 138 is then removed to expose the dielectric layer 118, as shown in FIG. 1E.

It should be noted that FIG. 1D is a schematic cross-sectional view taken along line II-II' of FIG. 2D. Therefore, after performing the second patterning process, the conductive strips 132b illustrated in FIG. 1D is removed (not shown). On the other hand, FIG. 1E and FIG. 3E are schematic cross-sectional views of the line I-I' and the line III-III' of FIG. 2E, respectively. Therefore, after performing the second patterning process, the conductive strips 132b illustrated in FIG. 1E is not removed to form conductive pillars 132c. The conductive pillars 132c illustrated in FIG. 3E are alternately arranged along the Y direction. In addition, the nitride layers 124a of FIG. 1D is also consumed, so that the thickness of the nitride layers 124b on the conductive pillars 132c is reduced.

In the present embodiment, as shown in FIG. 1E, the conductive strips 132a may be referred to as dummy source contact plugs, and the conductive pillars 132c may be referred to as dummy drain contact plugs. The positions of the dummy source/drain contact plugs are replaced by the subsequently formed source/drain contact plugs. In the embodiment, the dummy source contact plugs 132a and the dummy drain contact plugs 132c may be defined by two patterning processes or two mask patterns (i.e., the first photoresist pattern 130 and the second photoresist pattern 150). Compared with the manufacturing method in which the dummy source/drain contact plugs defined by a single patterning process, the two patterning processes of the present embodiment is able to avoid the pillar-shaped dummy drain contact plugs are cut off due to a difference in thickness of the conductive layer 120. Therefore, the present embodiment is able to maintain the shape and resistance value of the drain contact plugs, so as to improve the reliability.

Referring to FIG. 1F to FIG. 1K, a replacement process is performed to replace the conductive strips 132*a* and the conductive pillars 132*c* with a plurality of contact plugs 164*a* and 164*b*. Specifically, referring to FIG. 1F, a nitride layer 154 and an oxide layer 156 are sequentially formed on the substrate 100. The nitride layer 154 conformally covers the dielectric layer 118, the conductive strips 132*a*, the conductive pillars 132*c*, and the nitride layers 124*b*. The oxide layer 156 fills in gaps between the conductive strips 132*a* and the conductive pillars 132*c* and covers a highest top surface 154*t* of the nitride layer 154.

Referring to FIG. 1F and FIG. 1G, a planarization process is performed to expose the highest top surface 154*t* of the nitride layer 154. In the case, the highest the top surface 154*t* of the nitride layer 154 and a top surface 156*t* of the oxide layer 156 may be considered as coplanar.

Referring to FIG. 1G and FIG. 1H, a first etching process is performed to remove a portion of the oxide layer 156, a portion of the nitride layer 154, and the nitride layers 124*b* to expose the conductive strips 132*a* and the conductive pillars 132*c*, A second etching process is then performed to remove the conductive strips 132*a* and the conductive pillars 132*c* to expose a lowest top surface 118*bt* of the dielectric layer 118, In the case, as shown in FIG. 1H, a plurality of the openings 160 are formed on the doped regions 140 between the stack structures 102, respectively. In an embodiment, the openings 160 may be referred to as self-aligned openings because the openings 160 are formed without any mask and the openings 160 align the doped regions 140. Each of the self-aligned openings 160 includes a first opening 160*a* and a second opening 160*b*. In the present embodiment, the first openings 160*a* may be a strip shape which extends along the Y direction. The second openings 160*b* may be an island shape or a columnar shape which are alternately arranged along the Y direction. In an alternative embodiment, the first etching process and the second etching process may be, In addition, although the second etching process is used to remove the conductive strips 132*a* and the conductive pillars 132*c*, a portion the nitride layer 154 is still removed to form corners 156*c* on upper sidewalls of the openings 160, as shown in FIG. 1H.

It should be noted that, in the present embodiment, the protective layer 116 made of silicon nitride is used to protect the stack structures 102 from being damaged by the first etching process and the etching process, so as to maintain the shape of the stack structures 102, thereby improving reliability. In addition, after the second etching process, a plurality of conductive structures 158 still remain between the dielectric layer 118 and the nitride layer 154*a*, as shown in FIG. 1H. In the embodiment, the conductive structures 158 may further protect the stack structures 102 from being damaged by the first etching process and the second etching process. Specifically, the conductive structures 158 include a first conductive structure 158*a* and a second conductive structure 158*b*. In the embodiment, the first conductive structure 158*a* may be two strip structures, which are respectively disposed at both sides of the first the opening 160*a*. The second conductive structure 158*b* may be a ring structure that surrounds the second opening 160*b*.

Referring to FIG. 1H and FIG. 1I, the nitride layers 162 is formed on the substrate 100. The nitride layers 162 conformally covers surfaces of the oxide layer 156*a*, the nitride layer 154*a*, and the openings 160. In one embodiment, the nitride layers 162 may be about 10 nm to 20 nm.

In the embodiment, the thickness of the nitride layers 162 have to be thin enough and had good step coverage to cover the surfaces of the openings 160 without filling up the openings 160.

Referring to FIG. 1I and FIG. 1J, a third etching process is performed to remove the nitride layers 162, the dielectric layer 118, the protective layer 116, and the dielectric layer 114 underlying the openings 160, so as to extend the openings 160 downward, thereby exposing the silicide layer 142. In the third etching process, the nitride layers 162 on the top surface of the oxide layer 156*a* is also removed, so that the highest top surface of the remaining nitride layers 162*a*, the highest top surface of the adjacent nitride layer 154*a*, and the highest top surface of the oxide layer 156 are coplanar. In the embodiment, the nitride layers 162 may further protect the stack structures 102 from being damaged by the third etching process.

Referring to FIG. 1J and FIG. 1K, a conductive material is formed in the openings 160 to form a plurality of contact plugs 164, thereby accomplishing the memory device 10 of the present embodiment. In an embodiment, the conductive material comprises a metal material (e.g., W, Cu, AlCu, etc.), a barrier metal (e.g., Ti, TiN, Ta, TaN, etc.) or a combination thereof, In the embodiment, since the contact plugs 164 are formed without any mask and the contact plugs 164 align the doped regions 140, the contact plugs 164 may be referred to as self-aligned contact plugs.

Referring to FIG. 1K, the memory device 10 of the present embodiment includes: the substrate 100, the plurality of the stack structures 102, the dielectric layers 114 and 118, the protective layer 116, and the plurality of contact plugs 164. The stack structures 102 are disposed on the substrate 100. Specifically, each of the stack structures 102 is sequentially from bottom to top includes: the tunneling dielectric layer 104, the floating gate 106, the barrier layer 108, the control gate 110, and the cap layer 112. The dielectric layers 114 and 118 conformally cover the top surfaces and the sidewalls of the stack structures 102. The protective layer 116 is conformally disposed between the dielectric layer 114 and 118, and conformally covers the top surfaces and the sidewalls of the stack structures 102. The contact plugs 164 are disposed respectively on the substrate 100 between the stack structures 102. Specifically, as shown in FIG. 1K, the contact plugs 164 include a source contact plug 164*a* and a drain contact plug 164*b*. The source contact plug 164*a* is electrically connected to a doped region 140*a* by the silicide layer 142, wherein the doped region 140*a* may be referred to as a source. The drain contact plug 164*b* is electrically connected to a doped region 140*b* by the silicide layer 142, wherein the doped region 140*b* may be referred to as a drain. In an embodiment, the source contact plug 164*a* may be strip-shaped in the top view and extends along the Y direction. In another embodiment, the drain contact plugs 164*b* may be island-shaped in the top view and be disposed alternately along the Y direction.

As shown in FIG. 1K, the source contact plug 164*a* includes a narrower portion 164*a*1 and a wider portion 164*a*2 located on the narrower portion 164*a*1. A maximum width W2 of the wider portion 164*a*2 is greater than a maximum width W1 of the narrower portion 164*a*1. Further, a connection portion 164*a*3 is located between the narrower portion 164*a*1 and the wider portion 164*a*2 to connect the narrower portion 164*a*1 and the wider portion 164*a*2. It should be noted that, in the top view, the wider portion 164*a*2 is spaced apart from its adjacent protective layer 116 by a distance d. This distance d represents that the protective layer 116 protects the stack structures 102 from being damage by the first, second, and third etching processes, so as to maintain the shape of the stack structures 102. That is to say, the protective layer 116 is able to increase the process window of the foregoing etching processes without affecting the shape of the stack structures 102 due to the process variations.

In addition, the memory device 10 further includes the conductive structures 158 disposed respectively between the protective layer 116 and the contact plugs 164. In the embodiment, the conductive structures 158 may further protect the stack structures 102 from being damaging by the foregoing etching processes. Specifically, the conductive structures 158 include the first conductive structure 158a and the second conductive structure 158b. In the present embodiment, the first conductive structure 158a may be a strip structure disposed at both sides of the source contact plug 164a. The second conductive structure 158b may be a ring structure surrounding the drain contact plug 164b.

In summary, the present invention defines the source contact plugs and the drain contact plugs by two patterning processes, so as to maintain the shape and the resistance of the drain contact plugs, thereby improving reliability. In addition, the memory device of the present embodiment has the protective layer and the plurality of conductive structures. The protective layer conformally covers the top surface and the sidewalls of the stack structures. The conductive structures are disposed between the protective layer and the contact plugs. The protective layer and the conductive structures may protect the stack structures from being damaged by the etching processes and maintain the shape of the stack structures, thereby enhancing reliability.

What is claimed is:

1. A memory device, comprising:
   a plurality of stack structures, disposed on a substrate;
   a protective layer, conformally covering top surfaces and sidewalls of the plurality of stack structures;
   a plurality of contact plugs, disposed respectively on the substrate between the plurality of stack structures, wherein one of the plurality of contact plugs comprises a narrower portion and a wider portion over the narrower portion, and the wider portion is separated from an adjacent protective layer by a distance in a top view; and
   a plurality of conductive structures, disposed respectively between the protective layer and the plurality of contact plugs.

2. The memory device as recited in claim 1, wherein the plurality of contact plugs comprises:
   a plurality of source contact plugs, being strip-shaped in the top view and extending along a Y direction; and
   a plurality of drain contact plugs, being island-shaped in the top view and disposed alternately along the Y direction.

3. The memory device as recited in claim 1, wherein the plurality of conductive structures comprise a plurality of strip structures disposed respectively at two sides of the plurality of contact plugs.

4. The memory device as recited in claim 1, wherein the plurality of conductive structures comprise a plurality of ring structures surrounding respectively the plurality of contact plugs.

5. The memory device as recited in claim 1, wherein the plurality of conductive structures is higher than the protective layer.

6. The memory device as recited in claim 1, wherein one of the plurality of stack structures sequentially from bottom to top comprises: a tunneling dielectric layer, a floating gate, a barrier layer, a control gate, and a cap layer.

7. The memory device as recited in claim 1, wherein the plurality of contact plugs comprise a conductive material, and the conductive material comprises a metal material, a barrier metal, or a combination thereof.

8. The memory device as recited in claim 1, further comprising:
   a plurality of doped regions disposed in the substrate; and
   a plurality of silicide layers respectively disposed between the plurality of doped regions and the plurality of contact plugs to electrically connect the plurality of doped regions and the plurality of contact plugs.

9. The memory device as recited in claim 8, wherein the plurality of doped regions have a conductivity type opposite to a conductivity type of the substrate.

* * * * *